United States Patent [19]

Rauch

[11] 4,244,317

[45] Jan. 13, 1981

[54] BARGRAPH LIGHT GUIDE

[75] Inventor: Sol Rauch, Ottawa, Canada

[73] Assignee: Canadian Marconi Company, Montreal, Canada

[21] Appl. No.: 20,861

[22] Filed: Mar. 15, 1979

[51] Int. Cl.³ ............... G01D 11/28; G09F 09/00
[52] U.S. Cl. ..................... 116/202; 40/573; 116/272; 116/DIG. 5; 116/304; 362/32; 350/96.1
[58] Field of Search ......... 116/202, 304, 286, DIG. 5; 362/27, 32; 40/573; 350/101, 96.30, 99.32, 96.1

[56] References Cited

U.S. PATENT DOCUMENTS

| 2,520,758 | 8/1950 | Crownover | 116/304 X |
|---|---|---|---|
| 2,909,857 | 10/1959 | Wilson | 362/27 |
| 2,998,597 | 8/1961 | Edwards | 362/27 X |
| 3,451,681 | 6/1969 | Rossetti | 40/573 X |
| 3,648,044 | 3/1972 | Bernard et al. | 40/573 X |
| 3,712,705 | 1/1973 | Marcatili | 350/96.32 |
| 3,758,973 | 9/1973 | Miller | 40/573 X |
| 3,779,629 | 12/1973 | Green | 350/101 X |
| 3,809,877 | 5/1974 | Kwong | 362/32 |
| 3,901,674 | 8/1975 | Strack et al. | 350/96.30 X |
| 3,902,879 | 9/1975 | Siegmund | 350/96.30 X |
| 4,006,546 | 2/1977 | Anderson et al. | 40/573 |
| 4,023,887 | 5/1977 | Speers | 350/96.32 X |
| 4,128,298 | 12/1978 | McMillan | 362/32 |

FOREIGN PATENT DOCUMENTS 2504553  8/1976  Fed. Rep. of Germany ........ 350/96.32

*Primary Examiner*—Daniel M. Yasich
*Attorney, Agent, or Firm*—Melvin Sher; Alan Swabey; Robert E. Mitchell

[57] ABSTRACT

Present parameter value indicators are wasteful of space and expense and have parallax error if viewed at an angle. This invention is a vertical strip bargraph comprising separately illuminated squares of different colors to indicate values of the parameter without parallax error and economical of space and expense.

3 Claims, 6 Drawing Figures

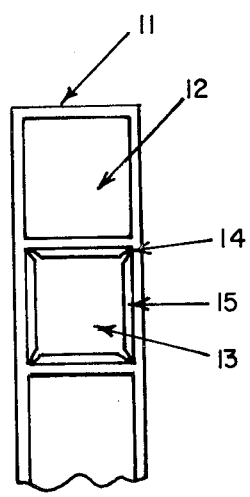
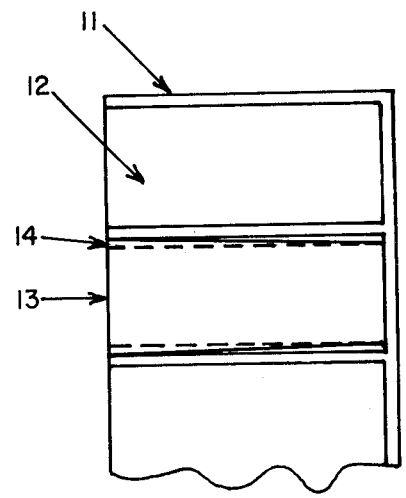
FIGURE 5
FIGURE 6

BARGRAPH LIGHT GUIDE

BACKGROUND OF THE INVENTION

1. Field of Invention

This invention relates to vertical strip indicators for the display of parameter values such as instantaneous values of aircraft engine characteristics and to the means for transmitting light from the illumination source to the visible face of the individual segments of which the vertical strip is composed.

2. Description of the Prior Art

In many fields of scientific and other endeavor it is necessary to measure continuously the value of certain characteristics such as pressure, temperature, force, etc. It is necessary to present these measurements by means of indicators to operators of the equipment to which the measurements pertain. Specifically in the case of aircraft it is most important that measurements of pressure, temperature, torque, and revolutions per minute of engines be presented to pilots and flight engineers instantly. In the past indicators used to present the information have been traditionally round with a clock-like dial showing the values attainable with a centrally pivoted needle or pointer to indicate the instantaneous value. Traditionally the dial face is black in color with white or fluorescent numerals and the pointer is white or fluorescent, the pointer being mounted one-eighth inch or more in front of the dial face to allow for pointer rotation.

Among the disadvantages inherent in the construction of the traditional indicators, two are most significant. First, the frontal area of the indicator is approximately 10 square inches when mounted on the aircraft cockpit panel which severely limits the number of indicators that can be mounted in the cramped cockpit space of modern aircraft. Secondly, parallax errors occur when the operator views the indicator from any angle other than exactly perpendicular. Parallax is described by Webster as "the apparent displacement of an object, as seen from two different points." In the particular case of an indicator which has its pointer mounted one-eighth inch or more from the dial face, the viewer sees the pointer indicating an incorrect value when the viewer views the indicator from any position other than exactly in front of the indicator, the incorrectness of the value increasing as the viewer is positioned further from the perpendicular.

Three previous inventions have been dedicated to indicators:
 U.S. Pat. No. 3,726,250 INDICATOR
 U.S. Pat. No. 3,809,877 INDICATOR POINTER
 U.S. Pat. No. 3,885,230 SYSTEM FOR IMPROVING THE RELIABILITY OF INDICATOR ARRANGEMENTS U.S. Pat. No. 3,726,250 teaches the replacement of the usual pointer in an indicator device by a path of moving light comprising a plurality of individually illuminable elements arranged in a circular pattern to follow the same configuration as did the numerical values when the indicator device was fitted with a pointer.

U.S. Pat. No. 3,809,877 teaches the reconfiguring of the path of moving light of U.S. Pat. No. 3,726,250 from its original circular shape to a vertical straight line which gives the indicator a thermometer-like appearance instead of the bulky traditional round hand-and-dial shape thus saving considerable space. U.S. Pat. No. 3,809,877 further teaches the use of individual incandescent light bulbs in intimate contact with the back of an opaque plate to provide individually illuminable elements, and further teaches that the individually illuminable elements are illuminated and extinguished in accordance with activation by logic circuitry which is in turn activated by the instantaneous value of the characteristic being measured.

U.S. Pat. No. 3,885,230 teaches the use of a plurality of separate power supplies for energizing the individually illuminable elements to prevent loss of indication in the event of a power supply failure.

OBJECTS OF THE INVENTION

The primary object of this invention is to provide a means for transmitting light from the individual incandescent light bulbs at the back of the opaque plate of U.S. Pat. No. 3,809,877 to the front surface of the plate so that each incandescent light bulb will illuminate only one individually illuminable element.

A further object of this invention is to provide individually illuminable elements in a vertical column, the face of said vertical column being flush with the surface of the opaque plate so a viewer can view the element from any angle in front of the indicator without experiencing a parallax error.

A further object of this invention is to provide individually illuminable elements of different colors to give the viewer a general indication that the characteristic being measured is at the normal, marginal, or dangerous level.

SUMMARY OF THE INVENTION

The instant invention is an improvement of U.S. Pat. No. 3,809,877, the subject matter of which is incorporated herein by reference, in that it describes the means of transmitting from the back of an opaque plate to its front or viewing surface for each of the individually illuminable elements, thus a light guide. The bargraph light guide comprises a molded plastic column which contains a number of cavities each measuring 0.1 inch × 0.1 inch × 0.25 inch, an equal number of colored plastic pellet inserts each molded to fit exactly into said cavities of the plastic column. Said pellet insert is molded to have protrusions along the 0.25 inch dimension at each corner of 0.1 inch × 0.1 inch face. When said pellet is inserted into said cavity the walls of the main body of the pellet are separated from the walls of the column cavity by an air gap resulting from the presence of said protrusions. The presence of an air gap surrounding the main body of the plastic pellet creates a fibre optic channel through which light can pass from the back to the front of the pellet without any light escaping through the walls. To explain, it is well known in the trade that light can be made to bend around corners in fibre optic strands because the refractive index of the material in the fibre optic strand is different from the refractive index of any immediately surrounding medium such as air, water, etc. When it strikes the surface or boundary between two media with different refractive indices light will always rebound and stay within its own medium thus remaining confined to the fibre optic strand.

In the instant invention the main body of the plastic pellet and its surrounding air gap constitute a fibre optic channel through which light can be transmitted to the front face of the pellet without allowing light to escape and provide undesirable illumination for an adjacent pellet. The front face of the pellet insert, after insertion into the plastic column, becomes an individually illuminable element of the vertical indicator. Said front face has a roughened surface to insure a uniform distribution of illumination over the surface area. With the pellet fully inserted into its column cavity, said column is mounted exactly flush with the front surface of the opaque plate. This flush conditon allows the viewer to see said front face clearly from any angle up to 80 degrees from the perpendicular and, because no indicator pointer or dial face is involved, the viewer can read the value of the characteristic to be measured without any parallax error. The pellet inserts are molded of transparent acrylic plastic in any color, but typically red, amber, and green. This allows the plastic column, after its pellets have been inserted, to give a multi-colored presentation as, for example, in the case of engine temperature, normal operating temperatures would be shown in green elements, marginal temperatures would be shown in amber elements, and dangerous temperatures would be shown in red elements.

The invention therefore achieves its objectives. It transmits the light from the incandescent light bulb of U.S. Pat. No. 3,809,877 to the front of the opaque plate without illuminating any adjacent elements, it eliminates parallax error, and it provides a color-based general indication of the values being measured. The invention provides a large saving in aircraft cockpit panel space, when compared with traditional dial indicators, due to its size and shape.

BRIEF DESCRIPTION OF THE DRAWINGS

The invention in its preferred embodiment is best described by reference to the figures in which
FIG. 5 is a large scale back view of a pellet inserted in a column cavity;
and
FIG. 6 is a large scale side view of a pellet inserted in a column cavity.

DETAILED DESCRIPTION OF THE DRAWINGS

Figures 1, 2:
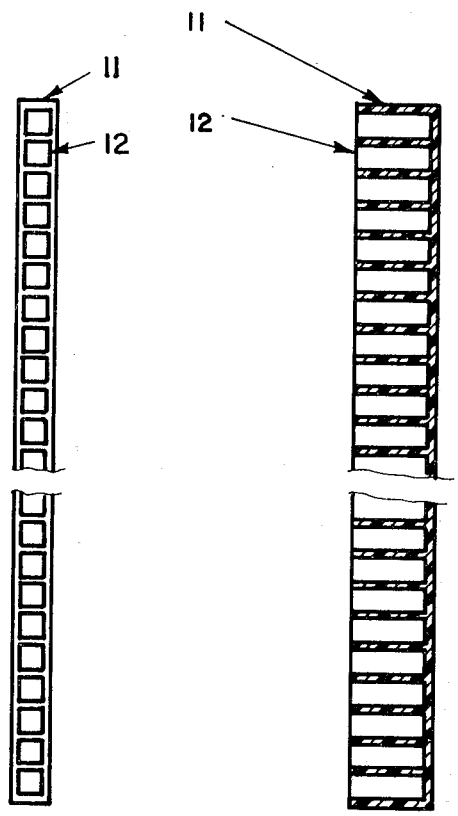
FIG. 1 is a back view of the plastic column
FIG. 2 is a side view of the plastic column
Figures 3, 4:
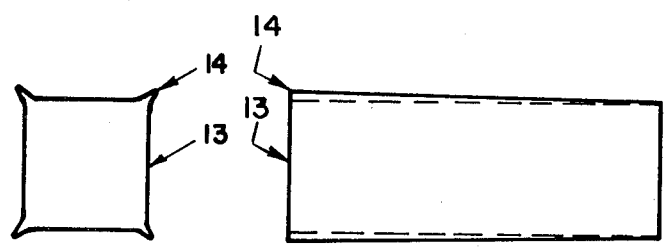
FIG. 3 is a large scale back view of a pellet insert
FIG. 4 is a large scale side view of a pellet insert

The column 11 complete with cavities 12 is molded from semi-transparent acrylic plastic. The pellet insert 13 is molded from transparent colored acrylic plastic. Flanges or separators 14 are molded parts of the pellet insert and are used when the pellet is inserted into cavity 12 to create an air gap between the pellet wall and the cavity wall, thereby creating a fibre optic channel by which means light from the appropriate incandescent light bulb of U.S. Pat. No. 3,809,877 is transmitted from the back to the front of the opaque plate. The light is prevented from escaping through the sides of the pellet by the very high impedance barrier at the junction of the two media having different refractive indices, namely air and plastic. Located behind each cavity is a light source (not shown), preferably an incandescent bulb. The light sources are electrically connected and controlled by logic circuits to be illuminated and extinguished in proper sequence to indicate increasing or decreasing parameter values.

I claim:
1. A bargraph light guide comprising:
an elongated plastic member having a front face and a back side opposite said side face;
a plurality of equal sized cavities extending into said plastic member from said back side to form at least one column of cavities along the length of said plastic member, each said cavity being defined by a cavity wall;
a like plurality of pellet inserts, each pellet having an outer wall, each pellet being inserted into a respective cavity; and
means spacing said outer wall of each pellet from the respective cavity wall of its respective cavity;
each said pellet comprising a light transmitting material;
said cavity wall comprising four wall members extending transversely into said plastic member;
whereby the cross-section of said cavity is a four-sided figure;
the cross-section of each pellet being generally of the same shape as the cross-section of said cavity;
said means for spacing being mounted between respective walls of said pellets and said cavities;
each of said cavity wall members being disposed at right angles to adjacent ones of said cavity wall members;
each of said cavity wall members being of the same length as every other cavity wall member, whereby the cross-section of said cavity is square in shape;
the cross-section of each pellet being similarly square in shape;
said means for separating comprising protrusions extending from each corner of each pellet.
2. A light guide as defined in claim 1 wherein each wall member is approximately 0.1 inches in length, and wherein each cavity extends 0.25 inches into said plastic member.
3. A light guide as defined in any of the claims 2, or 1 wherein, each pellet, when inserted into a respective cavity, constitutes a segment of the bargraph.

* * * * *